(12) United States Patent
Yang et al.

(10) Patent No.: US 8,133,810 B2
(45) Date of Patent: Mar. 13, 2012

(54) STRUCTURE FOR METAL CAP APPLICATIONS

(75) Inventors: Chih-Chao Yang, Albany, NY (US); Daniel C. Edelstein, White Plains, NY (US); Keith Kwong Hon Wong, Wappingers Falls, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 32 days.

(21) Appl. No.: 12/881,806

(22) Filed: Sep. 14, 2010

(65) Prior Publication Data

US 2011/0003473 A1    Jan. 6, 2011

Related U.S. Application Data

(62) Division of application No. 11/675,296, filed on Feb. 15, 2007, now abandoned.

(51) Int. Cl.
*H01L 21/44*        (2006.01)

(52) U.S. Cl. ............... 438/653; 257/E21.584; 438/622

(58) Field of Classification Search .............. 438/622, 438/624, 637, 653
See application file for complete search history.

(56) References Cited

U.S. PATENT DOCUMENTS

| | | | |
|---|---|---|---|
| 5,098,860 A | 3/1992 | Chakravorty et al. | |
| 5,930,669 A | 7/1999 | Uzoh | |
| 5,933,753 A | 8/1999 | Simon et al. | |
| 6,383,920 B1 | 5/2002 | Wang et al. | |
| 6,429,519 B1 | 8/2002 | Uzoh | |
| 7,217,653 B2 | 5/2007 | Wang et al. | |
| 2002/0192940 A1 | 12/2002 | Lee et al. | |
| 2005/0087871 A1* | 4/2005 | Abe | 257/751 |
| 2005/0253266 A1* | 11/2005 | Tsumura et al. | 257/758 |
| 2007/0123029 A1 | 5/2007 | Tsumura et al. | |

OTHER PUBLICATIONS

Raghavan et al., "Diffusion of Copper through Dielectric Films under Bias Temperature Stress," Thin Solid Films, (1995), 262.
Noguchi et al., "Impact of Low-K Dielectrics and Barrier Metals on TDDB Lifetime of Cu interconnects," Proceedings of IRPS, (2001), 355.

* cited by examiner

*Primary Examiner* — Chuong A Luu
*Assistant Examiner* — Nga Doan
(74) *Attorney, Agent, or Firm* — Scully, Scott, Murphy & Presser, P.C.; Katherine S. Brown, Esq.

(57) ABSTRACT

An interconnect structure is provided in which the conductive features embedded within a dielectric material are capped with a metallic capping layer, yet no metallic residue is present on the surface of the dielectric material in the final structure. The inventive interconnect structure has improved dielectric breakdown strength as compared to prior art interconnect structures. Moreover, the inventive interconnect structure has better reliability and technology extendibility for the semiconductor industry. The inventive interconnect structure includes a dielectric material having at least one metallic capped conductive feature embedded therein, wherein a top portion of said at least one metallic capped conductive feature extends above an upper surface of the dielectric material. A dielectric capping layer is located on the dielectric material and it encapsulates the top portion of said at least one metallic capped conductive feature that extends above the upper surface of dielectric material.

17 Claims, 5 Drawing Sheets

STRUCTURE FOR METAL CAP APPLICATIONS

CROSS REFERENCE TO RELATED APPLICATION

This application is a divisional of U.S. patent application Ser. No. 11/675,296, filed Feb. 15, 2007 the entire content and disclosure of which is incorporated herein by reference.

FIELD OF THE INVENTION

The present invention relates to a semiconductor structure and a method of fabricating the same. More particularly, the present invention relates to an interconnect structure that has better reliability and technology extendibility for the semiconductor industry.

BACKGROUND OF THE INVENTION

Generally, semiconductor devices include a plurality of circuits which form an integrated circuit (IC) fabricated on a semiconductor substrate. A complex network of signal paths will normally be routed to connect the circuit elements distributed on the surface of the substrate. Efficient routing of these signals across the device requires formation of multi-level or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

In the prior art, two different types of capping layers for protecting the conductive feature of an interconnect structure can be used. One type of capping layer comprises a dielectric capping material, while the other type of capping layer comprises a metallic capping material. Although both types of capping layers are available, the metallic capping layer typically has better (i.e., increased) adhesion strength to the underlying conductive feature as compared to that obtained using a dielectric capping layer.

The increased adhesion strength provided at the conductive feature/metallic capping layer interface results in better electromigration resistance as compared to the case when a dielectric capping layer is employed. For example, the selective deposition of a Co alloy on a Cu interconnect has been demonstrated to have a greater than 10 times electromigration resistance than the interconnect including a standard dielectric capping material.

Despite the improvement in electromigration resistance, the use of a metallic capping layer provides an interconnect structure in which metallic residue is present on the surface of the dielectric material between each conductive feature. This problem in prior art interconnect structures is shown in FIG. 1. Specifically, FIG. 1 shows a prior art interconnect structure 10 that includes a dielectric material 12 which has conductive features embedded therein. The conductive features include a conductive material 16 which is located within an opening provided in the dielectric material 12. The conductive material 16 is separated from the dielectric material 12 by a diffusion barrier 18. A metallic capping layer 20 is present on the upper exposed surface of each conductive feature, i.e., atop the conductive material 16. As shown, metallic residue 22 forms on the exposed upper surface of the dielectric material 12 during the formation of the metallic capping layer 20.

The presence of the metallic residue 22 between each of the conductive features hinders the reliability of the prior art interconnect structure 10 and has delayed using metallic capping layers for the last three generations.

In view of the above, there is a need for providing a new and improved interconnect structure which employs metallic capping layers atop the conductive features, while eliminating metallic residue from the dielectric material that is located between each conductive feature.

SUMMARY OF THE INVENTION

The present invention provides an interconnect structure (of the single or dual damascene type) and a method of forming the same, which removes unwanted metallic residue from the surface of the dielectric material which is located between each metallic capped conductive feature. The inventive interconnect structure has improved dielectric breakdown strength as compared to prior art interconnect structures. The inventive interconnect structure has better reliability and technology extendibility for the semiconductor industry.

The present invention solves the above mentioned problem and achieves the aforementioned objectives by providing an interconnect structure including at least one metallic capped conductive feature embedded in a dielectric material wherein a top portion of the at least one metallic capped conductive feature extends above an upper surface of the dielectric material. In the inventive structure, the upper extended portion of the metallic capped conductive feature is encapsulated within a dielectric capping layer. The 'recessed' dielectric material contains no metallic residue since the same have been removed during the inventive processing steps.

In general terms, the interconnect structure of the present invention comprises:

a dielectric material having at least one metallic capped conductive feature embedded therein, wherein a top portion of said at least one metallic capped conductive feature extends above an upper surface of said dielectric material; and a dielectric capping layer located on said dielectric material and encapsulating said top portion of said at least one metallic capped conductive feature that extends above the upper surface of said dielectric material.

In addition to the interconnect structure mentioned above, the present invention also provides a method of fabricating the same. In general terms, the method of the present invention comprises:

providing a dielectric material having at least one metallic capped conductive feature embedded therein, wherein a top portion of said at least one metallic capped conductive feature extends above an upper surface of said dielectric material; and forming a dielectric capping layer on said dielectric material which also encapsulates said top portion of said at least one metallic capped conductive feature that extends above the upper surface of said dielectric material.

In one embodiment, the providing said dielectric material having the at least one metallic capped conductive feature comprises forming a sacrificial dielectric layer on said dielectric material; forming a conductive feature embedded within said dielectric material; planarizing to provide a structure in which the sacrificial dielectric layer is substantially coplanar with said conductive material; forming a metallic capping layer on a conductive surface of said conductive feature, wherein during said forming said metallic capping layer metallic residue forms at a surface or within said sacrificial dielectric layer; and removing said sacrificial dielectric layer containing said metallic residue.

In another embodiment, the providing said dielectric material having the at least one metallic capped conductive feature comprises forming a sacrificial dielectric layer on said dielectric material; forming a polishing selective layer on said sacrificial dielectric layer; forming a conductive feature embedded within said dielectric material; planarizing to provide a structure in which the sacrificial dielectric layer is substantially coplanar with said conductive material, wherein said planarizing removes said polishing selective layer; forming a metallic capping layer on a conductive surface of said conductive feature, wherein during said forming said metallic capping layer metallic residue forms at a surface or within said sacrificial dielectric layer; and removing said sacrificial dielectric layer containing said metallic residue.

In yet another embodiment of the present invention, the providing said dielectric material having the at least one metallic capped conductive feature comprises forming a sacrificial dielectric layer on said dielectric material; forming a conductive feature embedded within said dielectric material; planarizing to provide a structure in which conductive material is substantially coplanar with said dielectric material, wherein said planarizing removes said sacrificial dielectric layer; forming a metallic capping layer on a conductive surface of said conductive feature, wherein during said forming said metallic capping layer metallic residue forms at a surface of said dielectric material; performing a chemical plasma process to form a damaged surface layer within the dielectric material which includes said metallic residue; and removing said damaged surface layer.

DETAILED DESCRIPTION OF THE INVENTION

The present invention, which provides an interconnect structure including a metallic capped conductive feature in which no metallic residue is present on the dielectric material between each of the metallic capped conductive features as well as a method of fabricating the same, will now be described in greater detail by referring to the following discussion and drawings that accompany the present application. The drawings of the present invention, which are referred to in the present application, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides an interconnect structure in which the conductive features embedded within a dielectric material are capped with a metallic capping layer, yet no metallic residue is present on the surface of the dielectric layer in the final structure. The inventive interconnect structure has improved dielectric breakdown strength as compared to prior art interconnect structures. Moreover, the inventive interconnect structure has better reliability and technology extendibility for the semiconductor industry.

Figure 1:
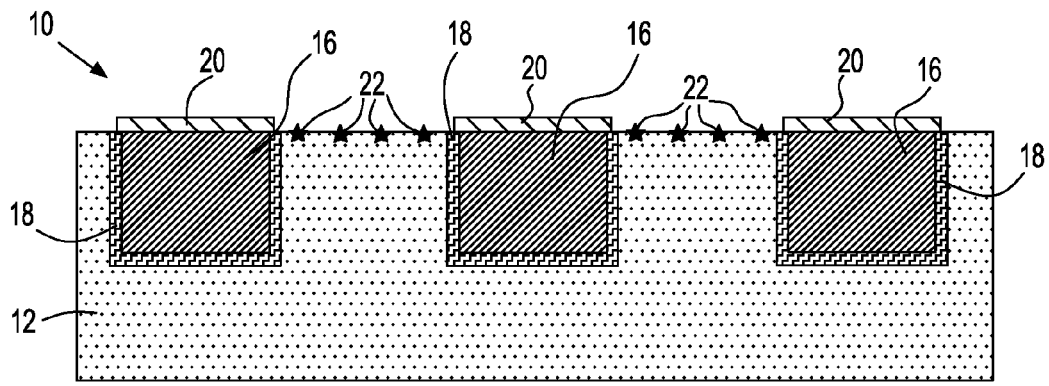
FIG. 1 is a pictorial representation (through a cross sectional view) depicting a prior art interconnect structure in which metallic capping layers are present atop each conductive material embedded within a dielectric material.
Figure 2:
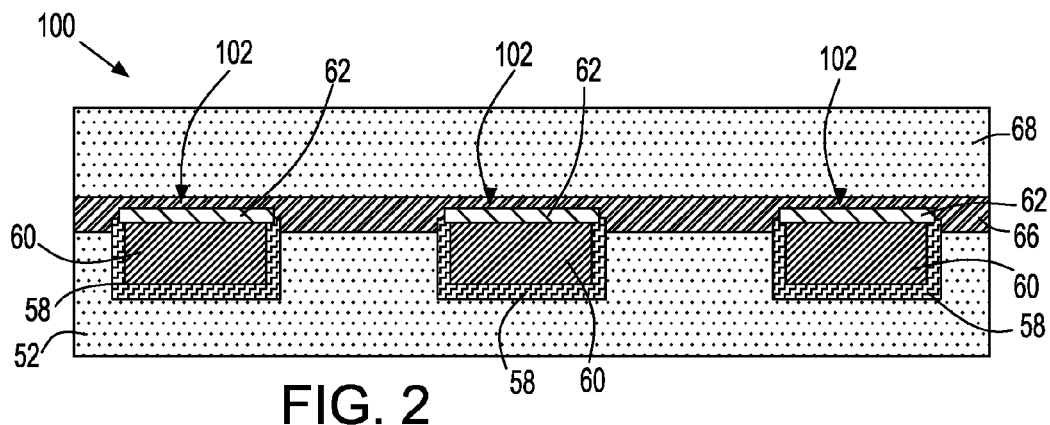
FIG. 2 is a pictorial representation (through a cross sectional view) depicting the interconnect structure of the present invention.

The interconnect structure 100 of the present invention is shown, for example, in FIG. 2. Specifically, the inventive interconnect structure 100 includes a dielectric material 52 having at least one metallic capped conductive feature 102 embedded therein, wherein a top portion of said at least one metallic capped conductive feature 102 extends above an upper surface of the dielectric material 52.

The at least one metallic capped feature 102 includes a metallic capping layer 62 and a conductive material 60. The conductive material 60 is separated from the dielectric material 52 by a diffusion barrier 58. The conductive material 60 and the diffusion barrier 58 are located within an opening that is formed into the dielectric material 52. A dielectric capping layer 66 is located on the dielectric material 52 and it encapsulates the top portion of said at least one metallic capped conductive feature 102 that extends above the upper surface of dielectric material 52. Another dielectric material 68 is typically, but not necessarily always, located atop the dielectric capping layer 66.

Reference is now made to FIGS. 3A-3F which illustrate basic processing steps employed in a first embodiment for fabricating the inventive interconnect structure 100 shown in FIG. 2. In the first embodiment of the present invention, a single sacrificial dielectric layer is used and is present during the formation of the metallic capped conductive feature. After forming the metallic cap on the exposed upper surface of the conductive material, the sacrificial dielectric layer, which now contains metallic residue, is removed from atop the dielectric material.

Figure 3A:
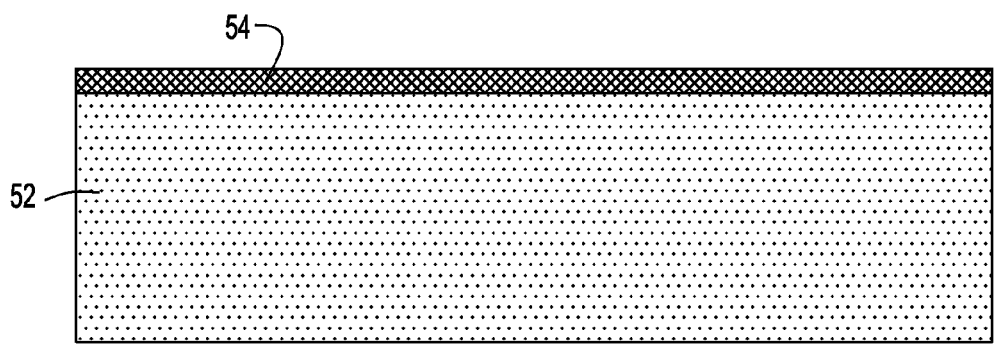
FIGS. 3A-3F are pictorial representations (through cross sectional views) depicting the basic processing steps employed in a first embodiment of the present invention.

FIG. 3A shows an initial structure that is employed in the first embodiment of the present invention. As illustrated, the initial structure includes a dielectric material 52 which contains a sacrificial dielectric layer 54 on an upper surface of the dielectric material 52. The dielectric material 52 is typically located on a surface of a substrate (not shown).

The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The dielectric material 52 comprises any interlevel or intralevel dielectric including inorganic dielectrics or organic dielectrics. The dielectric material 52 may be porous or non-porous. Some examples of suitable dielectrics that can be used as the dielectric material 52 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 52 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the dielectric material 52 may vary depending upon the dielectric material used as well as the exact number of dielectrics within the layer. Typically, and for normal interconnect structures, the dielectric material 52 has a thickness from about 200 to about 450 nm.

The dielectric material 52 is formed utilizing any conventional deposition process including, for example, chemical vapor deposition (CVD), plasma enhanced chemical vapor deposition (PECCVD), evaporation, chemical solution deposition and spin-on coating.

Following the formation of the dielectric material 52 on a substrate (not shown), the sacrificial dielectric layer 54 is formed on the upper surface of the dielectric material 52 utilizing conventional techniques well known to those skilled in the art. For example, the sacrificial dielectric layer 54 can be formed by CVD, PECVD, and spin-on coating. Alternatively, the sacrificial dielectric layer 54 can be formed by a thermal technique including, for example, thermal oxidation and/or thermal nitridation.

The sacrificial dielectric layer 54 includes any dielectric material having an etch selectively that differs from that of the underlying dielectric material 52. Particularly, the sacrificial dielectric layer 54 is an oxide, nitride or oxynitride of silicon. In one embodiment of the present invention, the sacrificial dielectric material 54 is silicon dioxide.

The thickness of the sacrificial dielectric layer 54 may vary depending on the technique used in forming the same as well as the material of the dielectric layer itself. Typically, the thickness of the sacrificial dielectric layer 54 must be thick enough so that during the subsequent formation of the metallic capping layer the metallic residue lays at the upper surface, or within, the sacrificial dielectric layer 54. The foregoing is achieved when the sacrificial dielectric layer 54 has a thickness from about 10 to about 150 nm, with a thickness from about 20 to about 80 nm being even more preferred.

Figure 3B:
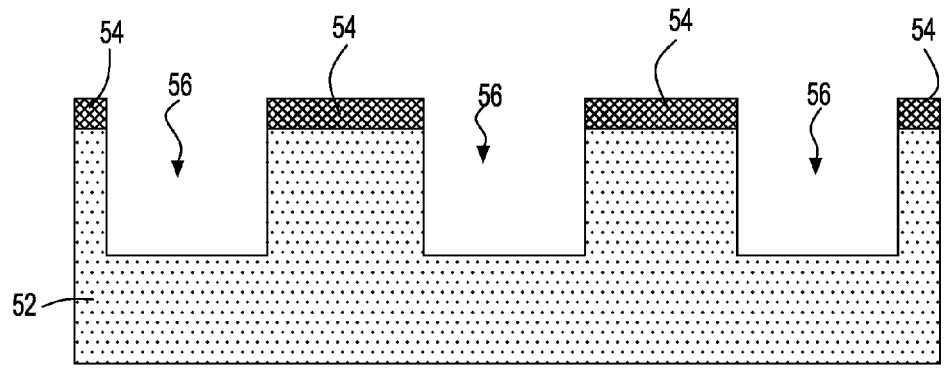

Next, and as shown in FIG. 3B, at least one opening 56 is formed into the dielectric material 52 utilizing lithography and etching. Specifically, a photoresist (not shown) is applied atop the sacrificial dielectric layer 54 utilizing a conventional deposition process. The photoresist is exposed to a pattern of radiation and then the exposed resist is developed utilizing a conventional resist developer. An etching process (dry and/or wet etching) is used to transfer the pattern from the patterned photoresist into the underlying sacrificial dielectric layer 54 and then into the dielectric material 52. During the etching process, the patterned photoresist can be removed (via a conventional stripping process) after transferring the pattern into at least the sacrificial dielectric layer 54.

The at least one opening 56 can be a line opening, a via opening or a combined line and via opening can be formed. When the latter is formed, a first via and then a line opening process may be used, or a first line and then a via process may be used. The combined line and via are typically used in forming dual damascene structures, while a line or via opening is used in forming a single damascene structure.

Figure 3C:
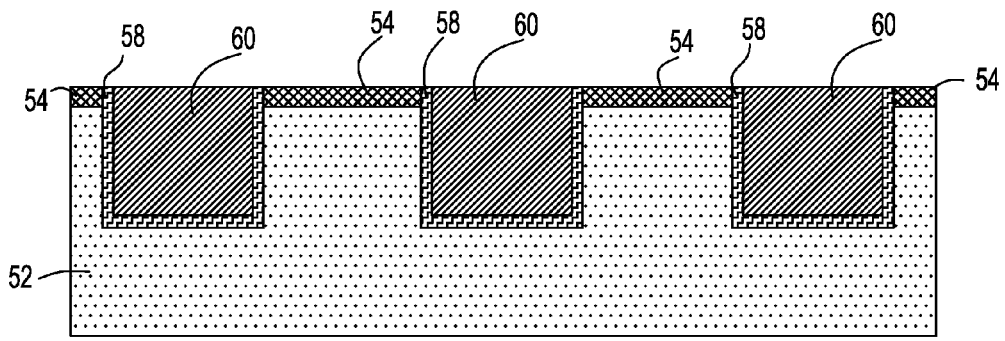
Figure 3D:
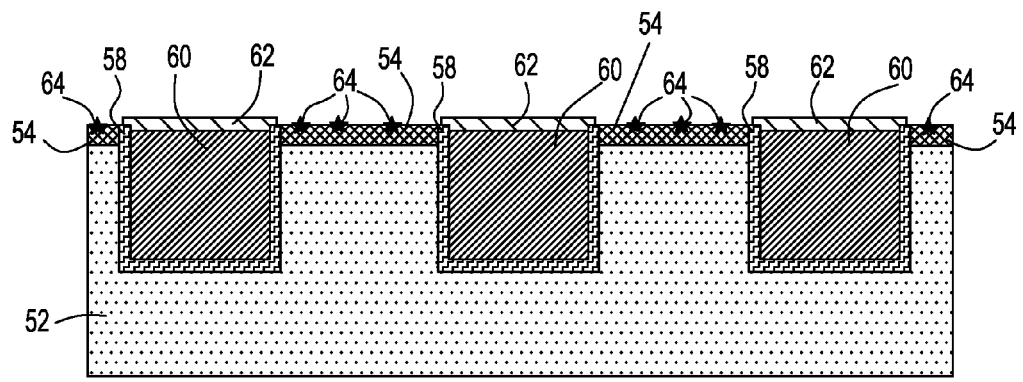

FIG. 3C shows the structure after forming a diffusion barrier 58 on the exposed wall portions of the dielectric material 52 within the at least one opening 56, forming a conductive material 60 within the at least one opening 56 atop the diffusion barrier 58 and planarization. The planarization provides a structure in which the upper surface of at least the conductive material 60 within the at least one opening 56 is substantially coplanar with an upper surface of the sacrificial dielectric layer 54.

The diffusion barrier 58 comprises one of Ta, TaN, TiN, Ru, RuN, RuTa, RuTaN, W, WN and any other material that can serve as a barrier to prevent conductive material from diffusing there through. The thickness of the diffusion barrier 58 may vary depending on the deposition process used in forming the same as well as the material employed. Typically, the diffusion barrier 58 has a thickness from about 4 to about 40 nm, with a thickness from about 7 to about 20 nm being more typical.

The diffusion barrier 58 is formed by a conventional deposition process including, for example, CVD, PECVD, atomic layer deposition (ALD), physical vapor deposition (PVD), sputtering, chemical solution deposition and plating.

The conductive material 60 used in forming a conductive feature embedded within the dielectric material 52 includes, for example, polySi, a conductive metal, an alloy comprising at least one conductive metal, a conductive metal silicide or combinations thereof. Preferably, the conductive material 60 that is used in forming the conductive feature is a conductive metal such as Cu, W or Al, with Cu or a Cu alloy (such as AlCu) being highly preferred in the present invention. The conductive material 60 is filled into the remaining at least one opening 56 in the dielectric material 52 utilizing a conventional deposition process including, but not limited to: CVD, PECVD, sputtering, chemical solution deposition or plating.

After deposition, a conventional planarization process such as, for example, chemical mechanical polishing (CMP) and/or grinding can be used to provide a structure in which the diffusion barrier 58 and the conductive material 60 each have an upper surface that is substantially coplanar with the upper surface of the sacrificial dielectric material 54.

Next, a metallic capping layer 62 is formed on the upper exposed surface of each of the conductive features, i.e., atop the conductive material 60. The resultant structure that is formed after forming the metallic capping layer 62 is shown, for example, in FIG. 3D. The metallic capping layer 62 comprises Co, Jr or Ru alone, or their alloy materials with at least one of W, B, P, Mo and Re. That is, one of Co, Jr and Ru with at least one of W, B, P, Mo and Re. The metallic capping layer 62 has a thickness that is typically within a range from about 2 to about 20 nm, with a thickness range from about 5 to about 10 nm being even more typical.

The metallic capping layer 62 is typically, but not necessary always, formed utilizing a directional deposition process including for example, a catalytic plating process and an electroless plating process. In some embodiments a non-directional deposition process such as sputtering, atomic layer deposition (ALD) and CVD can be used. It is noted that during the deposition of the metallic capping layer 62 metallic residue 64 forms on, or within, the sacrificial dielectric layer 54 that is located between each of the conductive features. The metallic residue 64 constitutes basically the same metallic material as that of the metallic capping layer 62.

Figure 3E:
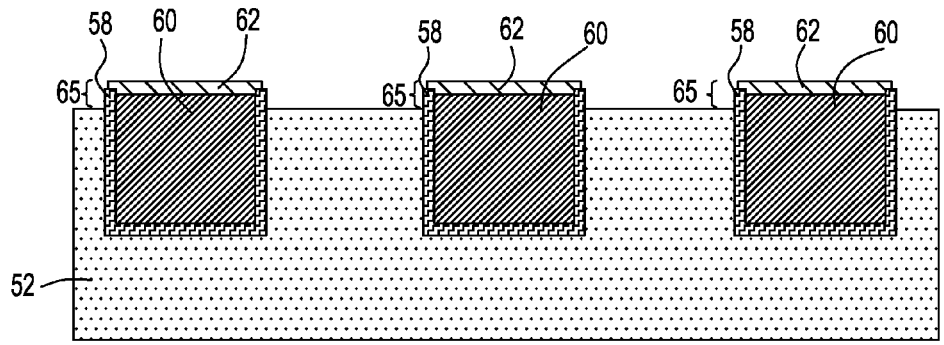

Next, and as shown in FIG. 3E, the sacrificial dielectric layer 54 including the metallic residue 64 is removed from atop the dielectric material 52 utilizing a wet etching process such as, for example, dilute HF. It is noted that the structure shown in FIG. 3E is different from a conventional interconnect structure in that an upper portion 65 of the conductive material 60 including the metallic capping layer 62 sticks above the surface of the dielectric material 54. That is, the inventive structure includes a metallic capped conductive feature having an extended top portion 65 which is not coplanar with the dielectric material. Instead, the dielectric material is 'recessed' relative to the extended top portion 65 of the metallic capped conductive feature of the present invention.

Figure 3F:
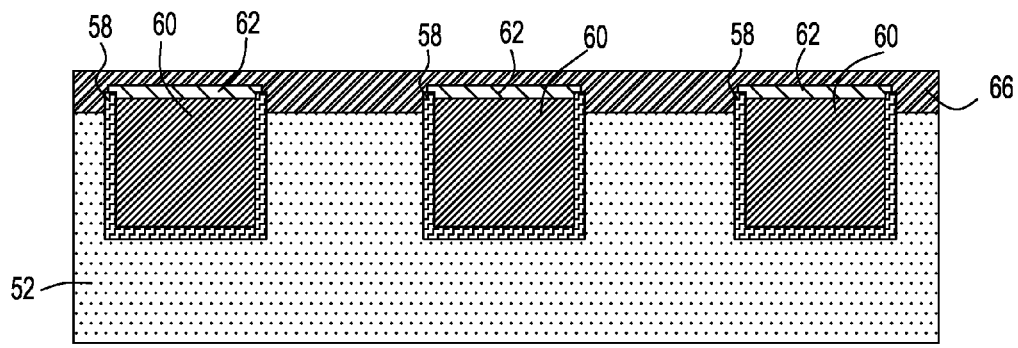

FIG. 3F shows the resultant structure that is formed after a dielectric capping layer 66 is formed. The dielectric capping layer 66 covers the upper exposed surface of the dielectric material 52 as well as the extended portion of the metallic capped conductive feature. That is, the dielectric capping layer 66 encapsulates the extended top portion 65 of the metallic capped conductive feature.

The dielectric capping layer 66 is formed utilizing a conventional deposition process such as, for example, CVD, PECVD, and spin-on coating. The dielectric capping layer 66 comprises any suitable dielectric capping material such as, for example, SiC, $Si_4NH_3$, $SiO_2$, a carbon doped oxide, a nitrogen and hydrogen doped silicon carbide SiC(N,H) or multilayers thereof. The thickness of the capping layer 66 may vary depending on the technique used to form the same as well as the material make-up of the layer. Typically, the capping layer 66 has a thickness from about 15 to about 55 nm, with a thickness from about 25 to about 45 nm being more typical.

Next, another dielectric material 68 is optionally formed over the dielectric capping layer 66 providing the structure shown in FIG. 2. The dielectric material 68 includes the same or different interlevel or intralevel dielectric material as dielectric material 52. As is the case with dielectric material 52, porous and non-porous materials are both completed. Further interconnect processing can be performed on dielectric material 68.

Figure 4A:
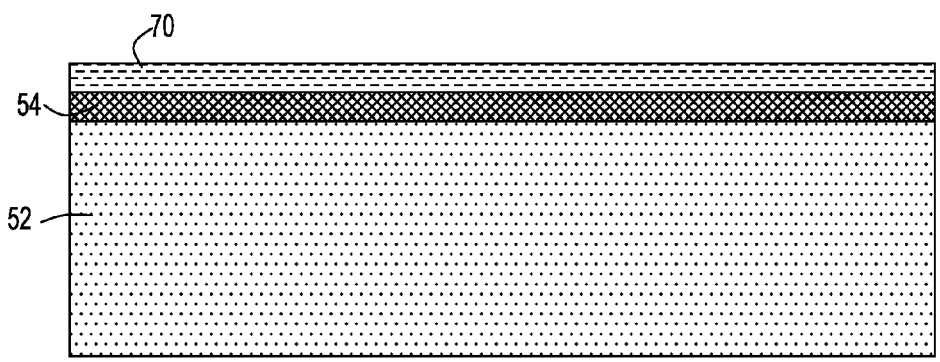
FIGS. 4A-4C are pictorial representations (through cross sectional views) depicting some of the processing steps employed in a second embodiment of the present invention.
Figure 4B:
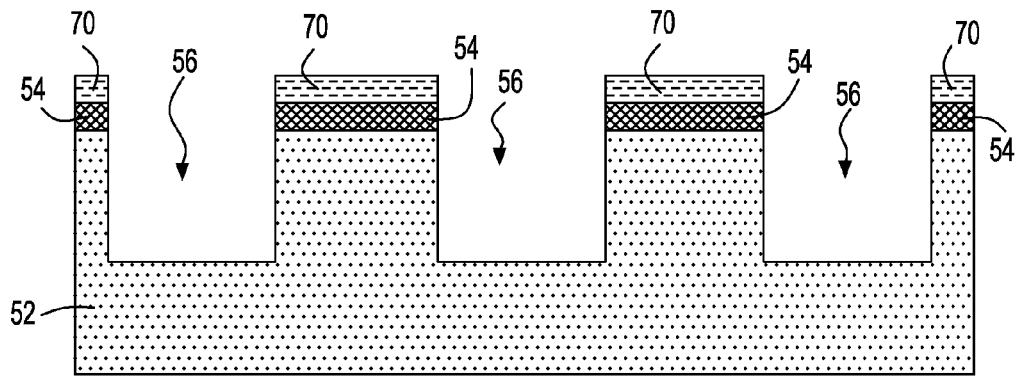
Figure 4C:
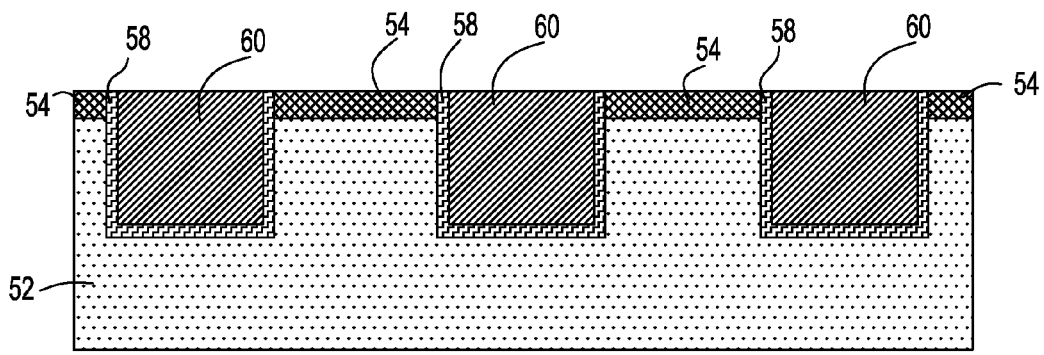

Reference is now made to FIGS. 4A-4C which illustrates some initial processing steps in accordance with a second embodiment of the present invention. The second embodiment differs from the first in that a polishing selective layer 70 is formed atop the sacrificial dielectric layer 54.

Reference is first made to FIG. 4A which shows the structure after forming the sacrificial dielectric layer 54 and the polishing selective layer 70 atop the dielectric material 52. The dielectric material 52, the sacrificial dielectric layer 54 as well as the techniques used in forming each have been described above. See, for example, the above discussion concerning FIG. 3A. After forming the sacrificial dielectric layer 54 on the upper surface of dielectric material 52, the polishing selective layer 70 is formed. The polishing selective layer 70 comprises any material that has a faster removal rate as compared to the sacrificial dielectric layer 54. Thus, for example, when the sacrificial dielectric layer 54 comprises silicon oxide, SiCOH or other low k (k less than 4.0) materials can be used as the polishing selective layer 70.

FIG. 4B shows the structure after forming at least one opening 56 into the structure shown in FIG. 4A. The at least one opening 56 is formed as described above and the various types of openings mentioned above are also contemplated herein for the second embodiment of the present invention.

FIG. 4C shows the structure after filling the at least one opening 56 with a diffusion barrier 58 and a conductive material 60 and after planarization. During the planarization process, the polishing selective layer 70 is removed. The second embodiment then proceeds by utilizing the processing steps associated with FIGS. 3D-3F above. After forming the dielectric capping layer 66 that encapsulates the extended top portion of the metallic capped conductive feature, the other dielectric material 68 is optionally formed as described above.

FIGS. 5A-5D illustrates a third embodiment of the present invention which differs from that of the first two embodiments described above. In this embodiment, a chemical, e.g., oxygen, nitrogen, ammonia and/or hydrogen plasma process is used to remove the metallic residue from the structure.

The third embodiment of the present invention begins by providing the structure shown in FIG. 3B utilizing the processing steps described above. Following the formation of the structure shown in FIG. 3B, and subsequent filling of the at least one opening 56 with a diffusion barrier 58 and a conductive material 60, a planarization process such as, for example, chemical mechanical polishing and/or grinding, is employed to provide the structure shown in FIG. 5A. As shown, the planarization process completely removes the sacrificial dielectric layer 54 from the structure such that the upper surfaces of the diffusion barrier 58, the conductive material 60, and the dielectric material 62 are substantially coplanar with each other.

Figure 5A:
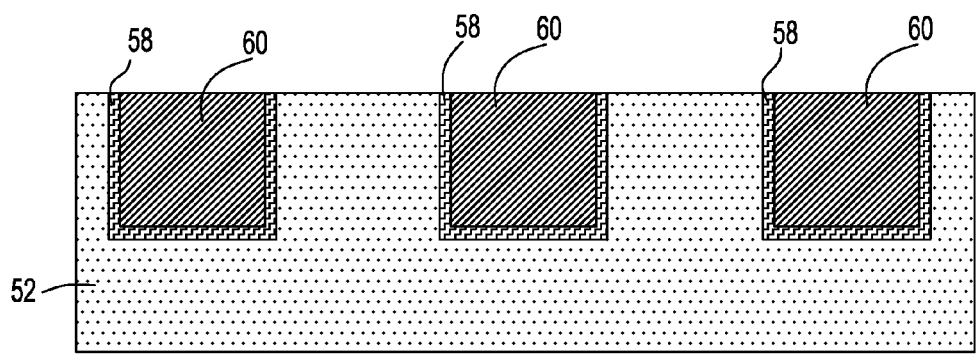
FIGS. 5A-5D are pictorial representations (through cross sectional views) depicting a third embodiment of the present invention.
Figure 5B:
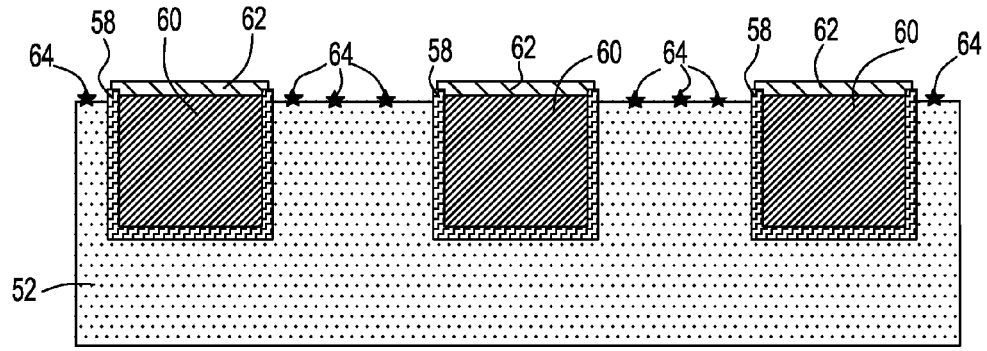

FIG. 5B illustrates the structure that is formed after the metallic cap layer 62 is formed on the exposed upper surface of the conductive material 60. The metallic cap layer 62 is formed as described above and during the deposition of the metallic cap layer metallic residue 64 forms on the exposed surface of the dielectric material 52 that adjoins the metallic capped conductive region.

Figure 5C:
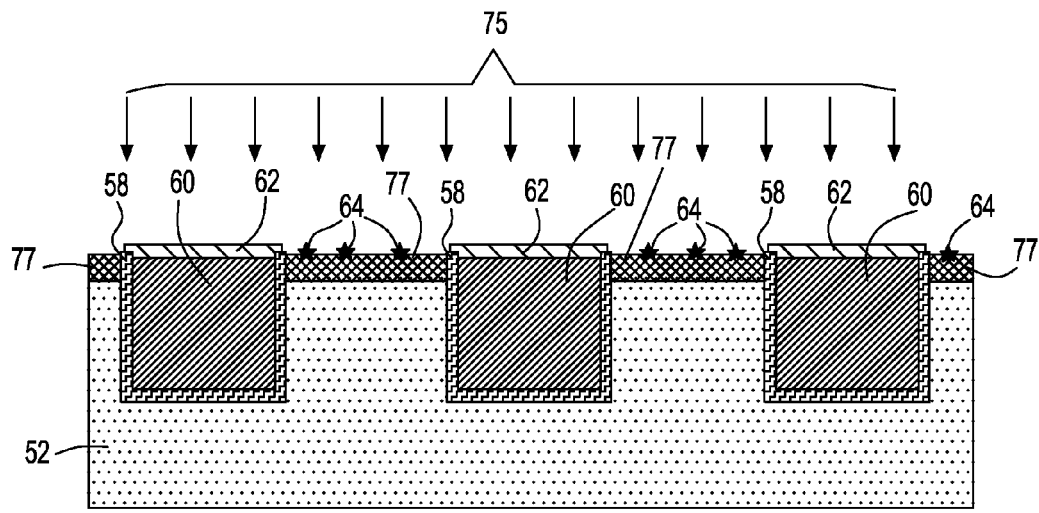

Next, a chemical plasma process 75 is performed to form a damaged surface layer 77 on the dielectric material 52. FIG. 5C illustrates the structure during this processing step of the present invention. The chemical plasma process 75 is performed utilizing a plasma of oxygen, nitrogen, ammonia and/or hydrogen. Preferably, an oxygen plasma is employed. The conditions for the chemical plasma process 75 are well known to those skilled in the art and are selected so as to form the damaged surface layer 77 within the dielectric material 52.

It is noted that the chemical plasma process typically, but not necessarily always, depletes C form the dielectric material 52. The depth of the damaged surface layer 77 that is formed may vary depending on the plasma conditions employed so long as the damaged surface region has a thickness in which the previously formed metallic residues 64 will be present. It is noted that the chemical plasma process consumes a surface portion of the dielectric material 52 such that the metallic residues 66 will be present in the damaged surface layer 77.

Figure 5D:
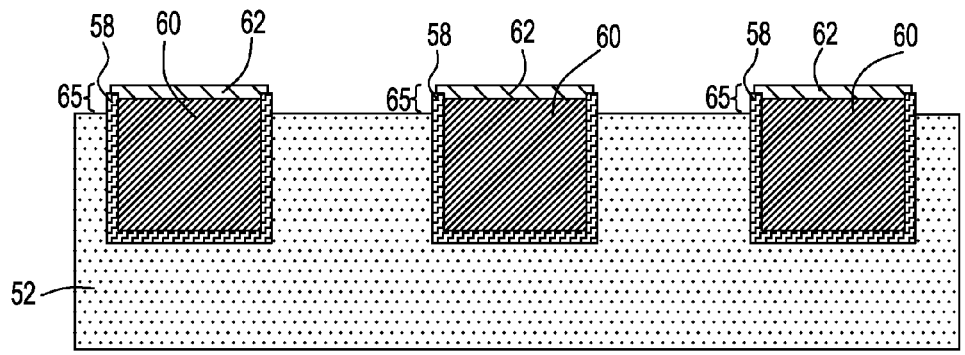

The damaged surface layer 77 is then removed from the structure providing the structure shown in FIG. 5D. As is illustrated, the resultant structure includes a 'recessed' dielectric material and an extended metallic capped conductive feature. This structure is the same as that shown in FIG. 3E above. The processing steps as described above in connection with FIG. 3F is then performed and thereafter the other dielectric material 68 can be formed as described above in regard to the first embodiment.

Notwithstanding which of the three embodiments are preferred, the resultant structure shown in FIG. 2 is obtained which has the extended portion of the metallic capped conductive feature encapsulated within the dielectric capping layer 66. It is noted that of the three embodiments described above, the third embodiment is highly preferred since its compatible with current CMP processing and no extra development work is required for optimizing the process.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming an interconnect structure comprising:
    providing a dielectric material having at least one metallic capped conductive feature embedded therein, wherein a top portion of said at least one metallic capped conductive feature extends above an upper surface of said dielectric material and wherein said providing includes a chemical plasma process to form a carbon-depleted surface layer within an upper portion of the dielectric material;
    removing the carbon-depleted surface layer from the dielectric material in a step subsequent to forming the carbon-depleted surface layer; and
    forming a dielectric capping layer on said dielectric material which also encapsulates said top portion of said at least one metallic capped conductive feature that extends above the upper surface of said dielectric material.

2. The method of claim 1 wherein said providing said dielectric material having the at least one metallic capped conductive feature comprises forming a sacrificial dielectric layer on said dielectric material; forming a conductive feature embedded within said dielectric material; planarizing to provide a structure in which a conductive material is substantially coplanar with said dielectric material, wherein said planarizing removes said sacrificial dielectric layer; forming a metallic capping layer on a conductive surface of said conductive feature, wherein during said forming said metallic capping layer metallic residue forms at a surface of said dielectric material; performing said chemical plasma process to form said C-depleted surface layer within the upper surface of the dielectric material which includes said metallic residue.

3. The method of claim 1 further comprising forming another dielectric material on an upper surface of said dielectric capping layer.

4. The method of claim 1 wherein the at least one metallic capped conductive feature comprises a metallic capping layer located on an upper surface of a conductive material.

5. The method of claim 4 wherein said metallic capping layer comprises Co, Ir or Ru or any one of Co, Ir and Ru that is alloyed with at least one of W, B, P, Mo and Re.

6. The method of claim 4 wherein said conductive material is Cu, W, Al or a Cu alloy.

7. The method of claim 1 wherein said forming said dielectric capping layer comprises selecting one of SiC, $Si_4NH_3$, $SiO_2$, a carbon doped oxide, a nitrogen and hydrogen doped silicon carbide and multilayers thereof.

8. The method of claim 1 wherein said chemical plasma process comprises a plasma including at least one of oxygen, nitrogen, ammonia and hydrogen.

9. The method of claim 1 wherein said chemical process comprises a plasma selected from one of nitrogen, ammonium and hydrogen.

10. The method of claim 4 wherein said metallic capping layer is selected from Ir, Ru, Ir alloyed with at least one of W, B, P, Mo and Re, and Ru alloyed with at least one of W, B, P, Mo and Re.

11. A method of forming an interconnect structure comprising:
    providing a dielectric material having at least one metallic capped conductive feature embedded therein, wherein a top portion of said at least one metallic capped conductive feature extends above an upper surface of said dielectric material, said top portion is formed by removing a carbon-depleted surface layer located at the surface of said dielectric material which included metallic residue therein, wherein said carbon-depleted surface layer is formed by a chemical plasma process and said removing the carbon-depleted surface layer is performed in a step following the forming of the same; and
    forming a dielectric capping layer on said dielectric material which also encapsulates said top portion of said at least one metallic capped conductive feature that extends above the upper surface of said dielectric material.

12. A method of foaming an interconnect structure comprising:
    providing a dielectric material having at least one conductive feature embedded therein, wherein said at least one conductive feature has an upper surface that is co-planar with an upper surface of the dielectric material;
    forming a metallic capping layer on said upper surface of the at least one conductive feature, wherein during said forming the metallic capping layer a metallic residue forms on said upper surface of the dielectric material that adjoins the at least one conductive feature;
    forming a carbon-depleted surface layer within the upper surface of the dielectric material that adjoins said at least one conductive feature, wherein said carbon-depleted region encapsulates said metallic residue; and
    removing the carbon-depleted surface layer and said metallic feature in a separate step subsequent to forming the carbon-depleted surface layer.

13. The method of claim 12 wherein said forming the carbon-depleted surface layer comprises a chemical plasma process.

14. The method of claim 13 wherein said chemical process comprises a plasma selected from one of oxygen, nitrogen, ammonium and hydrogen.

15. The method of claim 13 wherein said chemical process comprises a plasma selected from one of nitrogen, ammonium and hydrogen.

16. The method of claim 12 wherein said providing the dielectric material having at least one conductive feature embedded therein comprises providing an initial dielectric material, forming a sacrificial dielectric layer on an upper surface of the initial dielectric material, forming an opening through said sacrificial dielectric layer and extending into a portion of the initial dielectric material, forming at least a conductive material within said opening, and performing a planarization process in which a portion of the conductive material and said sacrificial dielectric layer are removed.

17. The method of claim 12 wherein said metallic capping layer is selected from Ir, Ru, Ir alloyed with at least one of W, B, P, Mo and Re, and Ru alloyed with at least one of W, B, P, Mo and Re.

* * * * *